United States Patent [19]
Van Der Vleuten

[11] Patent Number: 6,144,320
[45] Date of Patent: Nov. 7, 2000

[54] ARITHMETIC ENCODING AND DECODING OF AN INFORMATION SIGNAL

[75] Inventor: Renatus J. Van Der Vleuten, Eindhoven, Netherlands

[73] Assignee: U.S. Philips Corporation, New York, N.Y.

[21] Appl. No.: 09/273,285

[22] Filed: Mar. 19, 1999

[30] Foreign Application Priority Data

Mar. 23, 1998 [EP] European Pat. Off. .............. 98200914

[51] Int. Cl.$^7$ ...................................................... H03M 7/00
[52] U.S. Cl. .............................. 341/50; 341/107; 340/347
[58] Field of Search ................................. 341/50, 107, 51, 341/63; 340/347 DD

[56] References Cited

U.S. PATENT DOCUMENTS

| | | | |
|---|---|---|---|
| 4,286,256 | 8/1981 | Langdon, Jr. et al | 340/347 DD |
| 4,891,643 | 1/1990 | Mitchell et al. | 341/107 |

*Primary Examiner*—Brian Young
*Assistant Examiner*—John Nguyen
*Attorney, Agent, or Firm*—Michael E. Belk

[57] ABSTRACT

In an arithmetic encoder and/or a corresponding arithmetic decoder, an A parameter, related to the size of a value interval, is truncated prior to multiplying the A parameter times the probability of a symbol, and the carry-over of the multiplication is controlled in the re-normalizing step in the encoder or decoder.

26 Claims, 9 Drawing Sheets

ARITHMETIC ENCODING AND DECODING OF AN INFORMATION SIGNAL

FIELD OF THE INVENTION

The invention relates to the field of arithmetic encoding and corresponding decoding of information signals.

BACKGROUND OF THE INVENTION

Arithmetic coding is a well-known technique for lossless coding and an introduction can be found in any current source coding book. For a thorough understanding of the implementations of arithmetic coding that are most relevant for the current work, the reader is referred to [Lang84]. The history of arithmetic coding is nicely described in the appendix of this document. Further, [Howard94] gives an extensive explanation of arithmetic coding.

The implementation of arithmetic coding that is the subject of the present invention uses two finite-size registers, which are usually called C and A. The flow diagram of the encoder operation is shown in FIG. 1. The C register points to the bottom of an interval on the number line, the size of which is stored in A, see, e.g [Lang81] and [Penn88]. The interval is split into sub-intervals, each sub-interval corresponding to a symbol to be encoded and the size of each sub-interval corresponding to the probability of the associated symbol. For actually encoding a symbol, the C register is adjusted to point to the bottom of the sub-interval corresponding to the symbol and the A register is set to the size of the selected sub-interval. The A register (as well as C) is then normalized (left-shifted), before the next symbol is encoded. In general, after re-normalization, the value of A lies between the values k and 2k: $k \leq A < 2k$. In the present example, $k=\frac{1}{2}$ will be used.

For example, in the binary case, there are two sub-intervals and thus two possible updates of the C and A registers, depending on whether the bit to be encoded is the most probable symbol (MPS) or the least probable symbol (LPS). It is assumed that the MPS is assigned to the lower interval. The "Update A and C" block of FIG. 1 is shown for the binary case in FIG. 2. The probability of the input bit being the LPS is denoted by p (notice that $p \leq \frac{1}{2}$, because the probability of the MPS is $\geq \frac{1}{2}$). The input bit to be encoded is denoted by b. The values of b and p are provided by the "Read . . ." block. Now, if a MPS is to be encoded, C does not change, since the lower interval is selected and C already points to this interval. However, A does change and its update is A=A−A.p (using the fact that the probability of the MPS equals 1−p). If a LPS is to be encoded, both C and A are changed: C is updated as C=C+A−A.p and the new interval size is A=A.p. It should further be noted that, by a pre- and post-processing, it can be assured that the MPS is always e.g. the "0" bit and the LPS is always the "1" bit. Finally, FIG. 2 shows an "approximate multiplication" block, because it turns out that the multiplication A.p can be performed with low accuracy, at only a small loss of performance, thus reducing the hardware complexity. Techniques to do the approximate multiplication are discussed later on below.

For the non-binary case, the "Update A and C" block of FIG. 1 is shown in FIG. 3. The "Read . . ." block now provides the symbol to be encoded, s, as well as two probability values: the probability $p_s$ of symbol s and the cumulative probability $p_t$ of all symbols ranked below symbol s. As can be observed from FIG. 3, symbol M is treated differently from the others, in order to exactly "fill" A. It is shown in [Riss89] that it is advantageous to assign the MPS to symbol M.

In order to be able to decode, the decoder must know the value of C, since this determines the symbol that was encoded. So, what is sent to the decoder is the value of the C register. Actually, each time the A register is left-shifted in the renormalization process, the MSB of C (also referred to as "carry bit") is processed for transmission to the decoder. The problem with using a finite-size register for C is that a bit that was already shifted out of C could later have to be adjusted by a carry caused by incrementing C. To take care of this, carry-over control is needed. The state-of-the-art techniques completely solve the problem at the encoder, so the decoder is not affected by this. These solutions, which minimize decoder complexity, will also be discussed later on.

The decoder flow diagram is shown in FIG. 4. For the binary case, the "Output symbol . . ." block is shown in FIG. 5. In the non-binary case, the decoder is more complex, since it has to find the inverse of "C=C+D", without knowing the value of s.

The above citations and those listed on page 8 are hereby incorporated herein in whole by reference.

SUMMARY OF THE INVENTION

The invention aims at providing improvements for the above described arithmetic coders. In accordance with the invention, the encoding method includes a serial sequence of n-bit symbols, n being an integer for which holds $n \geq 1$, using finite sized first and second registers for storing an A parameter and a C parameter, respectively, the C parameter having a relationship with a boundary of a value interval and the A parameter having a relationship with the size of the interval, the method including the steps of (a) inputting a symbol of the information signal and at least one corresponding probability value of the associated symbol for encoding, (b) retrieving the values for the A and C parameters from the first and second registers, respectively, (c) splitting the value interval corresponding to the value retrieved from the first register into sub intervals corresponding to the at least one probability value, and selecting one of the subintervals in response to the said symbol, (d) updating at least the A parameter so as to bring its value in accordance with the size of the selected subinterval, in order to become the new size of the interval for encoding the next symbol in the information signal, (e) storing the updated value for the A parameter in the first register, (f) continue the method in step (a) for encoding the next symbol, characterized in that the step (b) further includes the substep of truncating the value of the A parameter $0.b_0 b_1 \ldots b_{i-1} b_i \ldots$ to the bit $b_{i-1}$ and adding '1' at the position of the bit $b_{i-1}$ to the truncated value of A, if $b_i$ equals '1'. In another elaboration, the encoding method includes a serial sequence of n-bit symbols, n being an integer for which holds $n \geq 1$, using finite sized first and second registers for storing an A parameter and a C parameter, respectively, the C parameter having a relationship with a boundary of a value interval and the A parameter having a relationship with the size of the interval, the method including the steps of:

(a) inputting a symbol of the information signal and at least one corresponding probability value of the associated symbol for encoding, (b) retrieving the values for the A and C parameters from the first and second registers, respectively, (c) splitting the value interval corresponding to the value retrieved from the first register into sub intervals corresponding to the at least one probability value, and selecting one of the subintervals in response to the symbol, (d) updating at least the A parameter so as to bring its value in accordance with the size of the selected subinterval, in order to become the new size of the interval for encoding the next symbol in the information signal, (e) storing the updated value for the A parameter in the first register, (f) continue the method in step (a) for encoding the next symbol, characterized in that the step (b) further includes the substep of truncating the value of the A parameter $0.b_0b_1 \ldots b_{i-1}b_i \ldots$ to the bit $b_{i-1}$ and, if $b_{i-1}=$'0' and $b_i=$'1', raise $b_{i-1}$ to '1'. In again another elaboration, the encoding method includes a serial sequence of n-bit symbols, n being an integer for which holds $n \geq 1$, using finite sized first and second registers for storing an A parameter and a C parameter, respectively, the C parameter having a relationship with a boundary of a value interval and the A parameter having a relationship with the size of the interval, the method including the steps of:

(a) inputting a symbol of the information signal and at least one corresponding probability value of the associated symbol for encoding, (b) retrieving the values for the A and C parameters from the first and second registers, respectively, (c) splitting the value interval corresponding to the value retrieved from the first register into sub intervals corresponding to the at least one probability value, and selecting one of the subintervals in response to the symbol, (d) updating at least the A parameter so as to bring its value in accordance with the size of the selected subinterval, in order to become the new size of the interval for encoding the next symbol in the information signal, (e) storing the updated value for the A parameter in the first register, (f) continue the method in step (a) for encoding the next symbol, characterized in that the step (b) further includes the substep of truncating the value of the A parameter $0.b_0b_1 \ldots b_{i-1}b_i \ldots$ to the bit $b_{i-1}$ and make the bit $b_{i-1}$ equal to '1'.

The improvements presented in this invention relate to the approximate multiplication blocks (which are used in both the encoder and the decoder) and the carry-over control, which takes place in the "Renormalize . . . " block, in the encoder only.

Those skilled in the art will understand the invention and additional objects and advantages of the invention by studying the description of preferred embodiments below with reference to the following drawings which illustrate the features of the appended claims:

BRIEF DESCRIPTION OF THE DRAWING

These and other aspects of the invention will be described in more detail hereafter, in which

" in FIG. 4, for the binary case. The LPS probability is p and the value of the bit that is decoded is put in b.

DETAILED DESCRIPTION OF THE DRAWING

Figure 1:
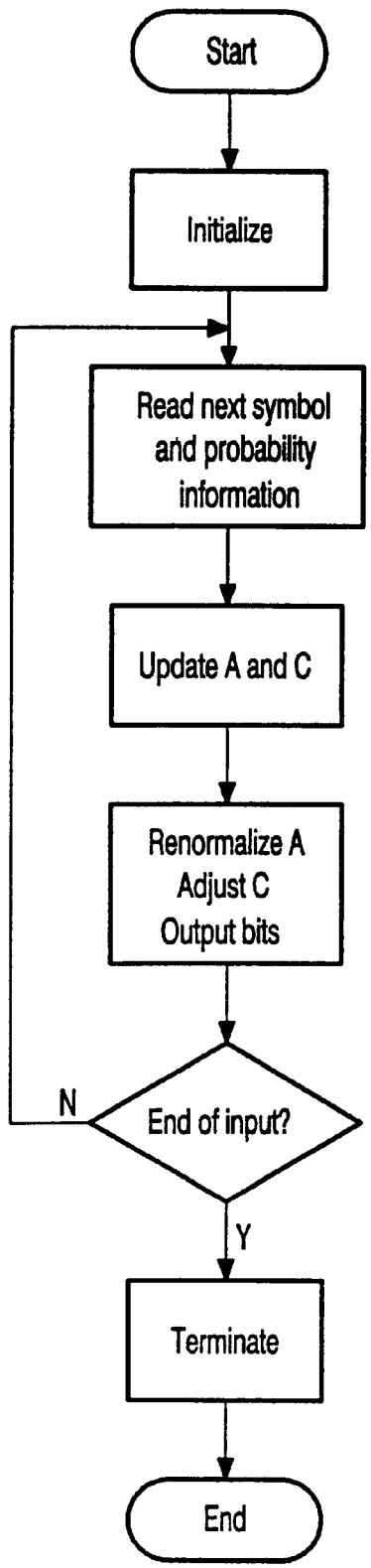
FIG. 1 shows a flow diagram of the arithmetic encoder.
Figure 2:
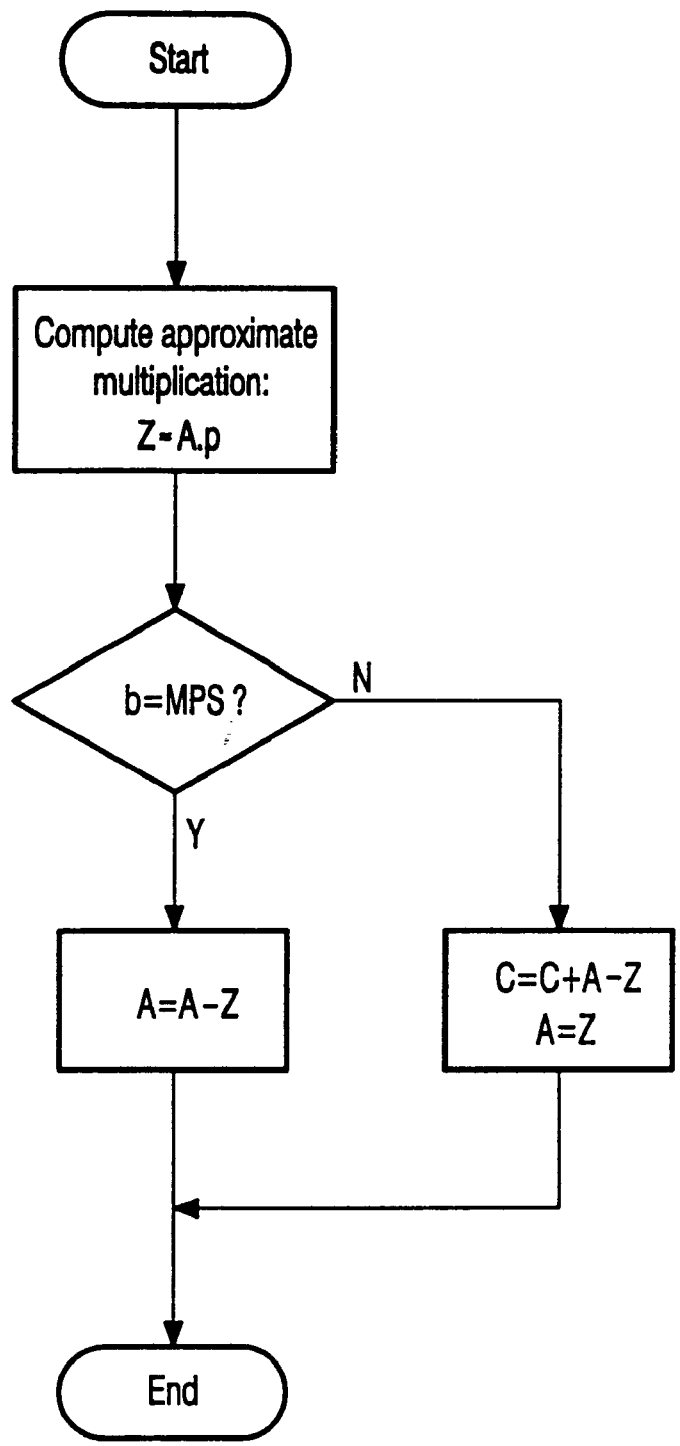
FIG. 2 shows the flow diagram of the encoder block "Update A and C" in FIG. 1, for the binary case. The LPS probability is p and the value of the bit that is to be encoded is held by b.
Figure 3:
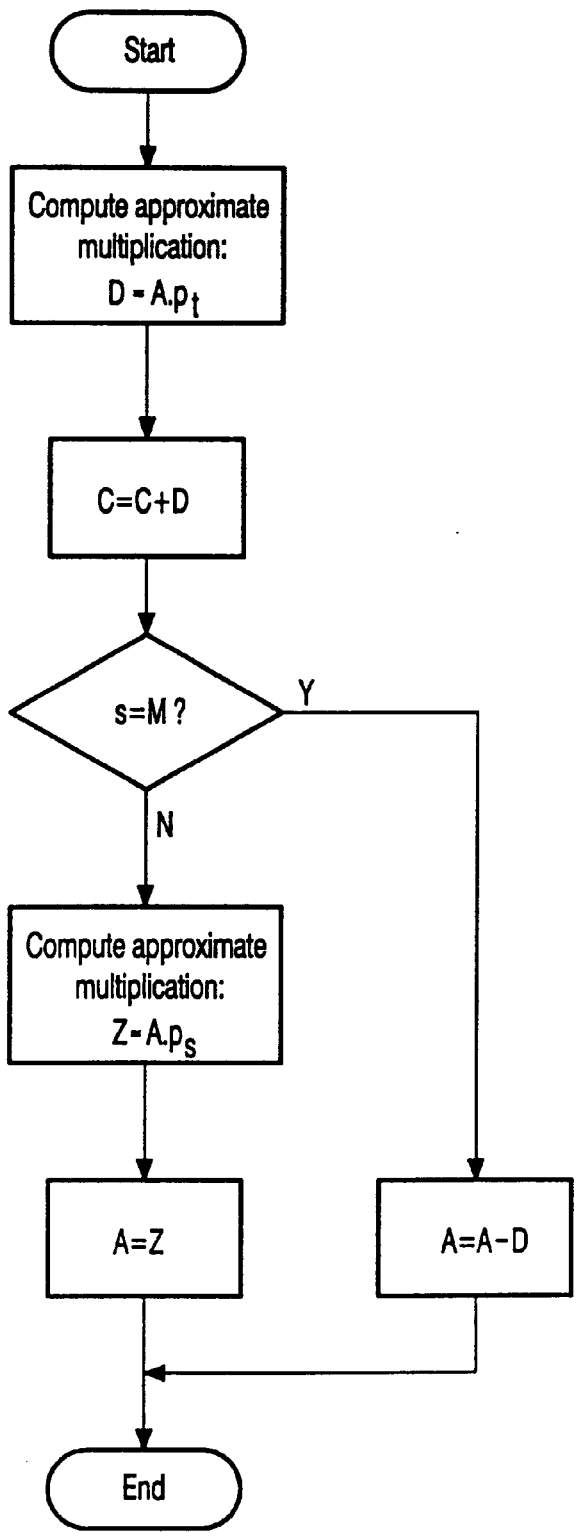
FIG. 3 shows the flow diagram of the encoder block "Update A and C" in FIG. 1, for the non-binary case. The value of the symbol that is to be encoded is held by s and its probability is held in $p_s$. The M+1 symbols are numbered 0, . . . M. $p_r = p_0+p_1+ \ldots +P_{s-1}$ is the cumulative probability of all symbols ranked below symbol s.

As regards the improvements to the multiplication, the following can be said. The problem of "avoiding" the multiplication A.p was solved in [Lang81] by approximating p by 2 exp {-Q}, where Q is an integer. Multiplication by p then simply corresponds to a right shift by Q positions. Q is called the skew number. Later, such as in [Riss89] the A register was normalized such that $0.75 \leq A<1.5$. It was then assumed that $A \approx 1$, so $A.p \approx p$.

Still better performance was obtained in [Chev91a] and [Chev91b]. They claim approximating A by eliminating all binary digits less significant than a predetermined binary 1 digit, and their preferred embodiment is to use the second most significant binary 1 digit. Thus, in the preferred embodiment, the value of A is approximated by a binary number containing two non-zero bits, which implies that the multiplication can be performed using a single shift and add operation. Finally, [Feyg93] describes an improved approximation of A, that also can be implemented using a single shift and add operation.

The method(s) that is(are) actually used in the present invention to approximate the multiplication are as follows. Let the probabilities (p) be described using NP bits. For example, if NP=8, then p=¼=2 exp{-2}=0.01 (binary) would be represented by binary 01000000, i.e. the "0." is not included, since it is the same for all probabilities. The size of the A register is chosen as NA=NP+NX bits, where NX represents the number of bits that are used to approximate the value of A that is used for the multiplication. For example, let NX=3 and A=¾=0.11, then A would be a 8+3=11-bit register containing 11000000000 (notice that again the "0." is dropped, since we normalize A such that it is always less than one). For the multiplication, we approximate A by a 3-bit number; in this case, it is clear that the best approximation is 110. The result of the approximate multiplication A.p would then be 00110000000, i.e. again an 11-bit number. This way of implementing the approximate multiplication was suggested, amongst others, in [Feyg93].

Below, an discussion will be given as to how the NA-bit number A should be approximated by NX bits.

The first way of approximating A (the method P1) includes rounding A to NX bits instead of truncating it. Rounding means that A is truncated to NX bits if the (NX+1)th bit of A is a 0 and that 1 is added to this truncated representation if the (NX+1)th bit is a 1. For example, if A=1101 . . . the 3-bit approximation would be 111. The rounding that is applied increases the complexity, since, in about half of the cases, 1 has to be added to the truncated representation, which means either an add operation or a table lookup must be done.

As an alternative (method P2), it is proposed to adopt a what is called "partial rounding". By partial rounding, a 1 is only added to the truncated representation of A in case the (NX+1)th bit is a '1' and the NXth bit is a '0'. In the implementation this means that the NXth bit of the approximation of A equals the logical OR of the NXth and (NX+1)th bits of the original A. For example, A=1101 . . . would be approximated by 101 and A=1001 . . . . would be approximated by 101 as well, whereas A=1000 . . . would be approximated by 100. Notice that the partial rounding results in the same approximation as the "full rounding" in about 75% of the cases.

In another alternative (method P3), it is proposed to approximate A by truncating it to NX bits and to always set the NXth bit of the approximation to 1, with the idea that this further reduces the complexity of a hardware implementation, since it eliminates half of the possible approximate values for A.

The performance of some known methods have been compared to the three new methods described above. The performances of the various methods are listed in table I The methods that are shown in the table, in addition to the three approximation methods (P1, P2 and P3) described above, are a reference method, denoted 'reference', which computes the full NA×NP-bit multiplication and only then truncates A to NA bits, the method of [Moff95], the method of [Chev91a], the method described in section 3 of Feyg93, denoted Feyg93(1), and the method described in section 4 of Feyg93, denoted Feyg93(2).

| method | NX = 2 | NX = 3 | NX = 4 |
| --- | --- | --- | --- |
| reference | 100 | 100 | 100 |
| Moff95 | 101.25 | 100.33 | 100.09 |
| Chev91a | 101.24 | 100.57 | 100.45 |
| Feyg93 (1) | 101.22 | 100.32 | 100.19 |
| Feyg93 (2) | 100.52 | 100.12 | 100.04 |
| P1 | 100.33 | 100.12 | 100.03 |
| P2 | 100.57 | 100.19 | 100.05 |
| P3 | 101.66 | 100.44 | 100.10 |

The numbers that are listed are relative sizes of the compressed files, with 100 corresponding to "no loss" due to a non-perfect approximation of the multiplication. For example, a number of 100.57 means that the size of the compressed file is increased by 0.57% due to the approximate multiplication.

As expected, the performance of method P2 is better than that of method Moff95, but not as good as that of method P1.

The method P2 is a good compromise. More specifically, P2 for NX=3 and NX=4 provides a good trade-off between performance and complexity, since its performance is practically the same as that of method P1 (see the above table), at a lower complexity. For NX=2, method P1 is the preferred method, whilst the method P3 can be used for NX=5 and larger.

In the non-binary case, methods that can approximate the value of A by rounding up have the potential problem that there could be no "room" left for the MPS, when the alphabet size increases [Feyg93]. For method Feyg93(2), the worst-case limit on the alphabet size is 11 [Feyg93]. The presently proposed new approximation methods have the advantage that the amount by which A can be increased by rounding up decreases as NX is increased. Therefore, if there is an application in which the probability distribution is such that the alphabet size is limited (and the performance of the methods that can only truncate, or round down, is insufficient), a larger alphabet can be handled by increasing NX.

The carry-over control problem in the renormalization step in the encoder was originally solved by a technique called "bit stuffing" [Lang81]. This technique "catches" the carry by inserting a 0 stuff bit into the coded stream in case a series of 1 bits has been encountered. The disadvantages of this technique are that it reduces the compression efficiency, because of the extra stuff bits, and that it requires special processing in the decoder.

A method to prevent the carry-over without affecting the compression performance was described in [Witt87]. This method has the disadvantage that the decoder complexity is somewhat increased. The idea of [Witt87] was adapted in [Cham90], such that it could be used without increasing the decoder complexity.

Figure 6:
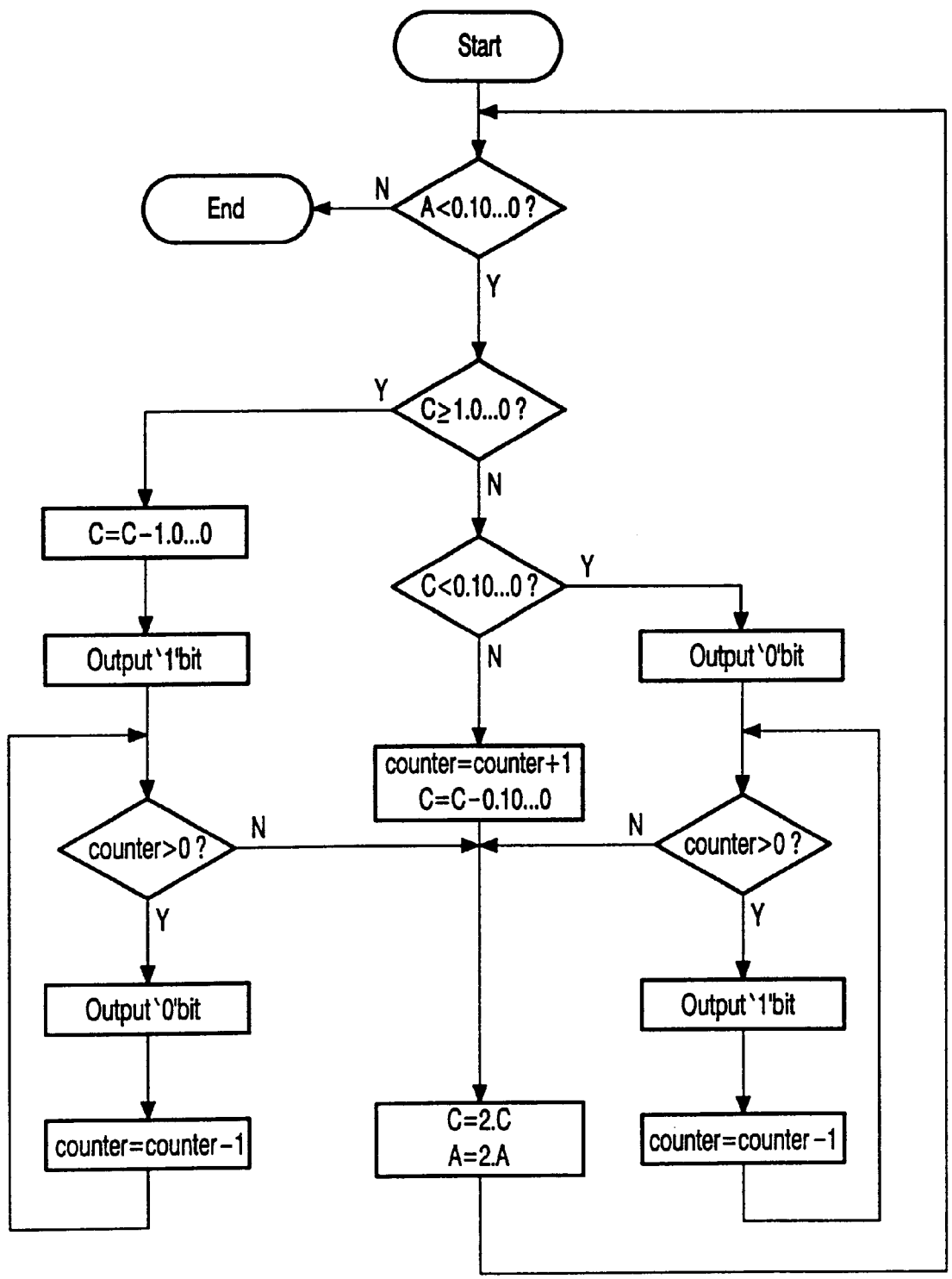
FIG. 6 shows the flow diagram of the encoder block denoted "Renormalize . . . " in FIG. 1.

Here, a different solution is presented that also does not increase the decoder complexity. The flow diagram of the encoder renormalization procedure in accordance with the invention is shown in FIG. 6. The main improvement is the block with C<0.10 . . . ?. For this same block, the prior art uses C+A<=1.0 . . . ?, and thus requires an extra add operation, compared to the present proposal.

Figure 7:
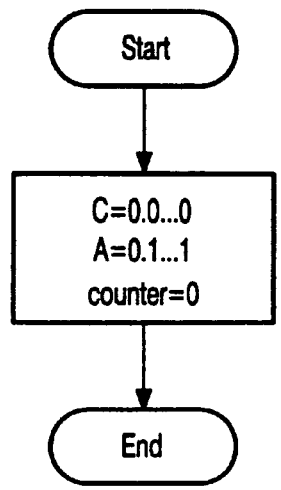
FIG. 7 shows the flow diagram of the encoder block denoted "Initialize" in FIG. 1.
Figure 8:
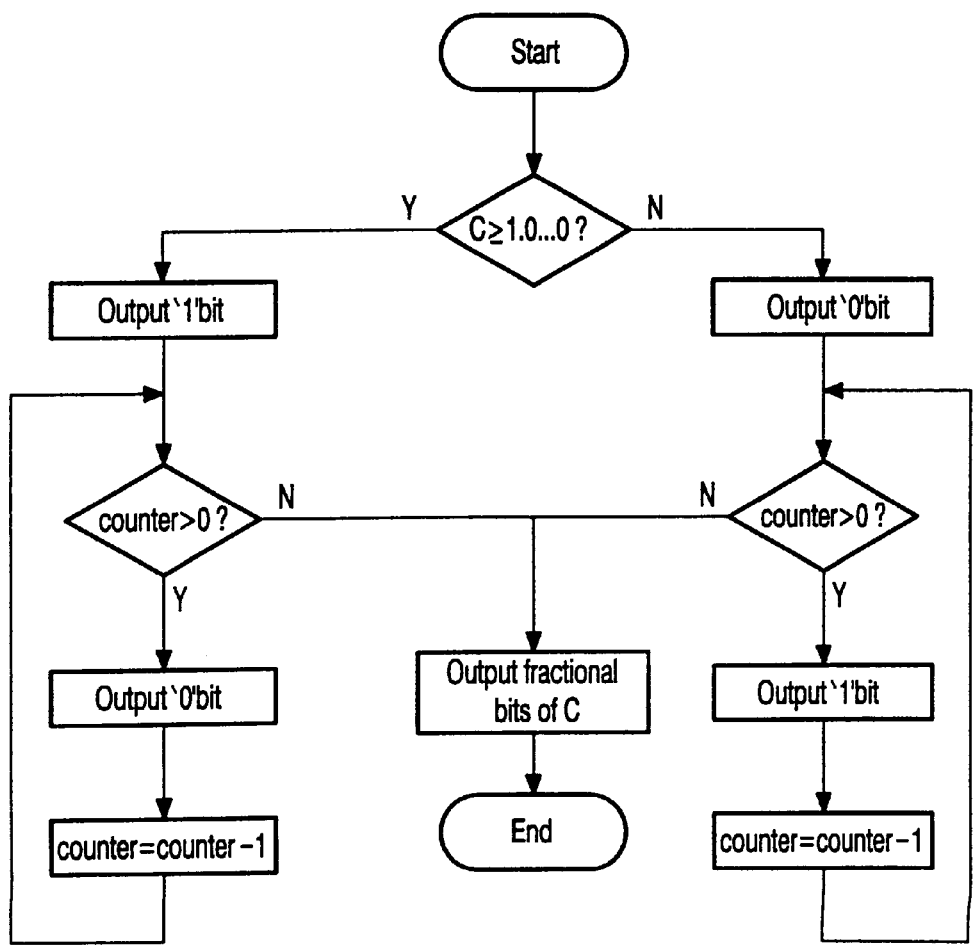
FIG. 8 shows a flow diagram of the encoder block denoted "Terminate" in FIG. 1.

To complete the description of the encoder, the initialization and termination blocks are shown in FIG. 7 and FIG. 8, respectively. The counter variable is the same as the one that is used in the encoder renormalization block shown in FIG. 6. Since the size of C is (NA+1) bits (in the encoder), it has NA fractional bits ("bits after the point"), which are output on termination, as shown in FIG. 8.

Figure 4:
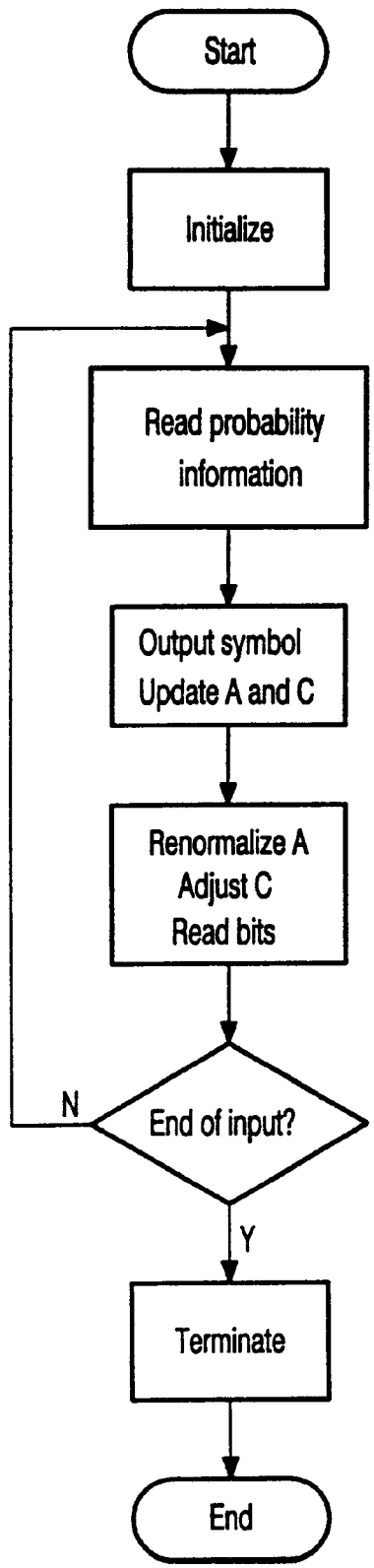
FIG. 4 shows a flow diagram of the decoder.
Figure 5:
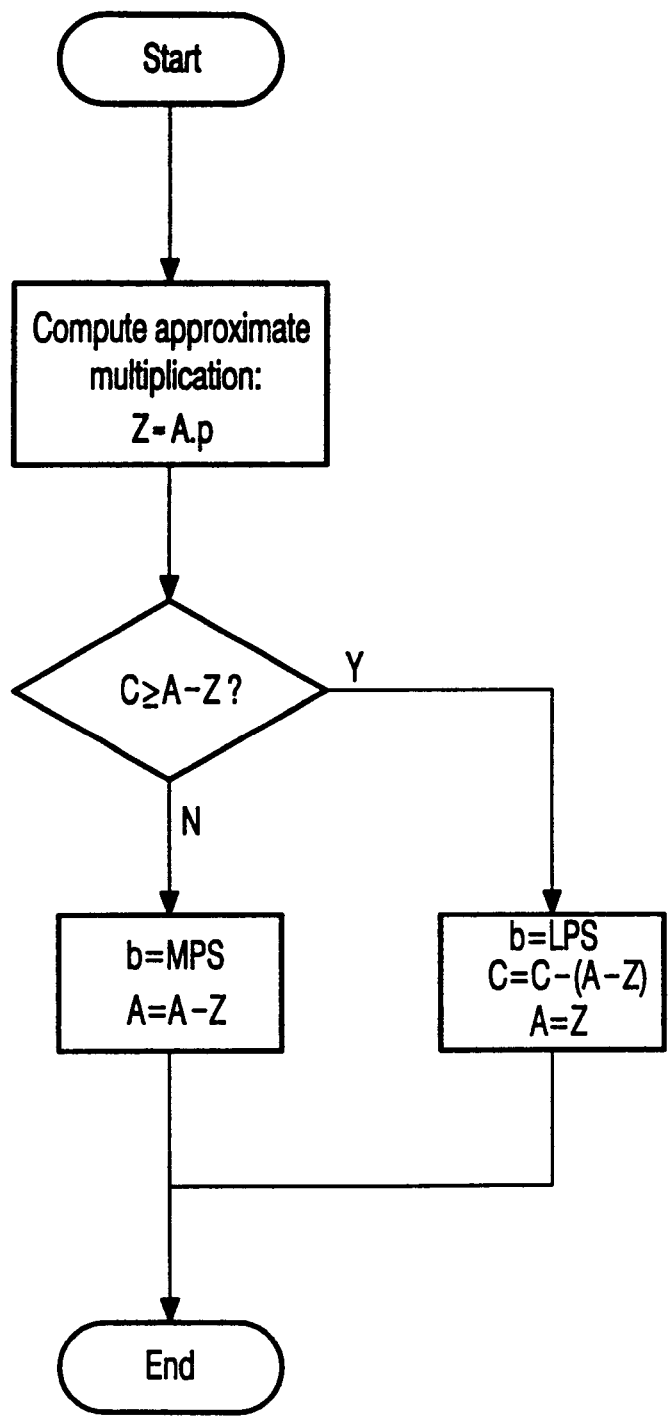
FIG. 5 shows the flow diagram for decoder block "Output symbol . . .
Figure 9:
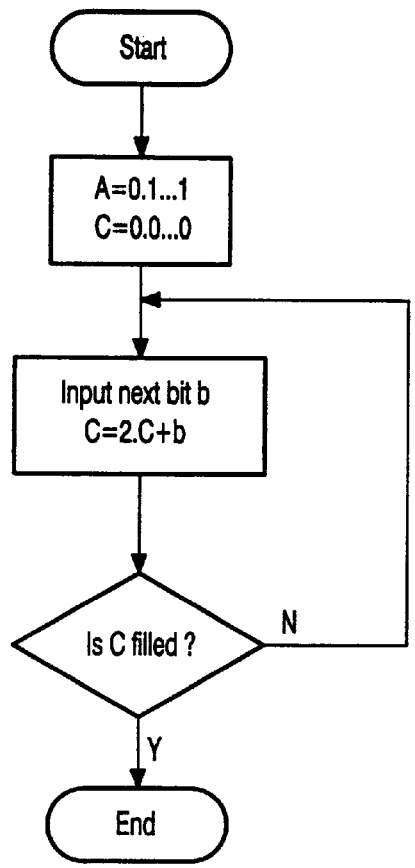
FIG. 9 shows a flow diagram of the decoder block denoted "Initialize" in FIG. 4.
Figure 10:
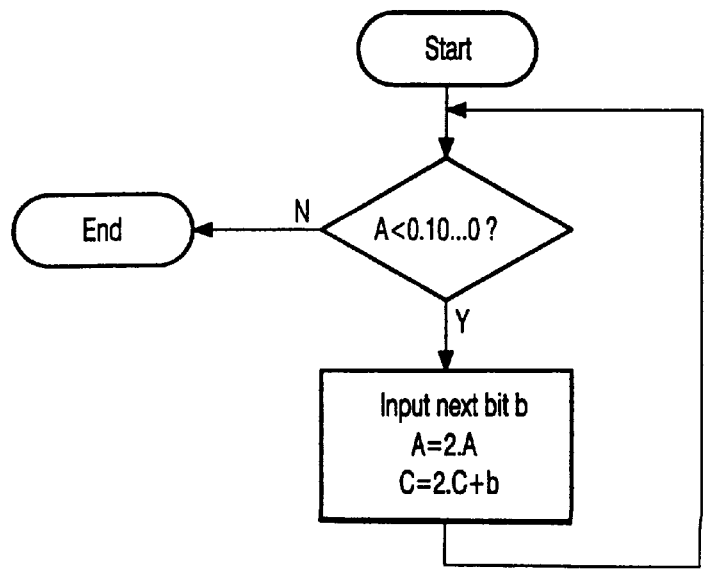
FIG. 10 shows a flow diagram of the decoder block denoted "Renormalize . . . " in FIG. 4.

The decoder initialization is shown in FIG. 9. The C register is filled by reading (NA+1) bits from the stream. The first bit read is a "dummy", since it is always a "0" bit. The size of the C register in the decoder is only NA bits, so one less than in the encoder. There is no special termination in the decoder (the "Terminate" block in FIG. 4 is empty). The renormalization in the decoder (the "Renormalize . . . " block in FIG. 4) is shown in FIG. 10.

Figure 11:
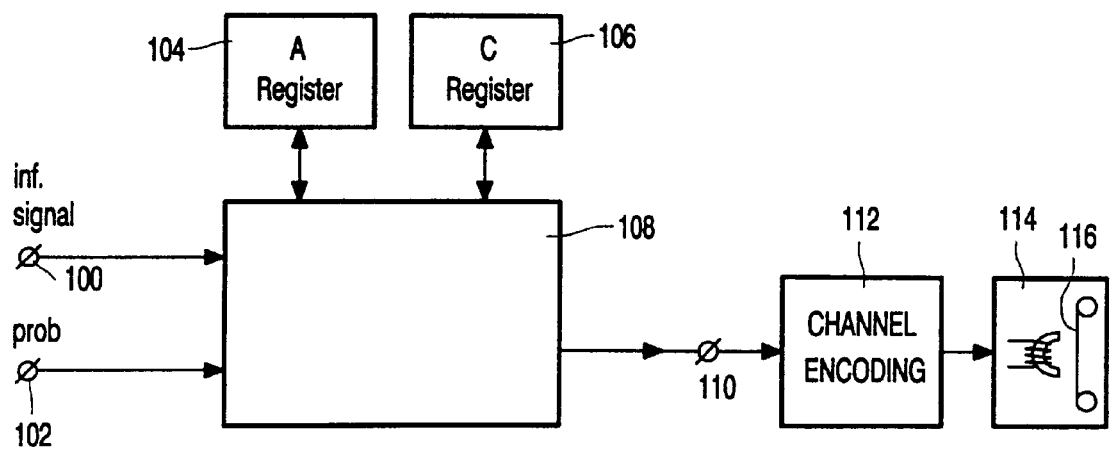
FIG. 11 shows an embodiment of the encoder apparatus.

FIG. 11 shows an embodiment of the encoder apparatus in accordance with the invention. The apparatus includes input terminals 100 and 102, for receiving the information signal and a probability signal, respectively. The information signal includes a serial sequence of n-bit symbols, n being an integer for which holds n≧1. The probability signal applied to the input terminal 102 includes one or more probabilities for each symbol in the information signal. For binary symbols, the probability signal includes one probability for each symbol. Finite sized first and second registers 104 and 106, respectively, are present, for storing the A parameter and the C parameter.

A processing unit 108 is available for carrying out the arithmetic coding on the information signal. It should be understood that, without going into very much detail as regards the processing unit 108, this unit includes circuitry for retrieving the values for the A and C parameters from the first and second registers, as well as circuitry for storing the updated and renormalized values for A and C in the first and second registers 104 and 106, respectively, after having encoded a symbol. Further, the unit 108 includes circuitry for splitting the value interval corresponding to the value retrieved from the first register 104 into sub intervals corresponding to the at least one probability value applied to the input terminal 102, and circuitry for selecting one of the sub intervals in response to the symbol applied to the input terminal 100.

Circuitry for updating the A and C parameters are also present, where this circuitry is required so as to bring the A value in accordance with the size of the selected subinterval, and so as to bring the C value in accordance with a boundary of the subinterval.

An output terminal 110 is available outputting encoded bits in response to the encoded symbols.

The retrieval apparatus for retrieving the A and C parameters from their corresponding registers further comprises means for truncating the value of the A parameter, prior to carrying out the calculation A.p. More specifically, this truncation can be as follows: suppose the value for A is expressed as $0.b_0 b_1 \ldots b_{i-1} b_i \ldots$. This value is truncated to to the bit $b_{i-1}$, and a '1' is added at the position of the bit $b_{i-1}$ to the truncated value of A, if $b_i$ equals '1'.

In another elaboration, the value of the A parameter is truncated to the bit $b_{i-1}$, and, if $b_{i-1}$='0' and $b_i$='1', the bit $b_{i-1}$ is raised to '1'. In again another elaboration, the A parameter is truncated to the bit $b_{i-1}$ and the bit $b_{i-1}$ is made equal to '1'.

It will be appreciated that the processing unit 108 is capable of carrying out the method, as disclosed in the FIGS. 1, 2, 3, 6, 7 and 8.

Preferably, the encoder apparatus is further provided with a channel encoding unit 112, well known in the art, for channel encoding (and, if needed, error correction encoding) the encoded information signal into a channel encoded information signal, and a write unit 104 for writing the channel encoded signal onto a record carrier, such as a magnetic record carrier 116, or an optical record carrier 118.

Figure 12:
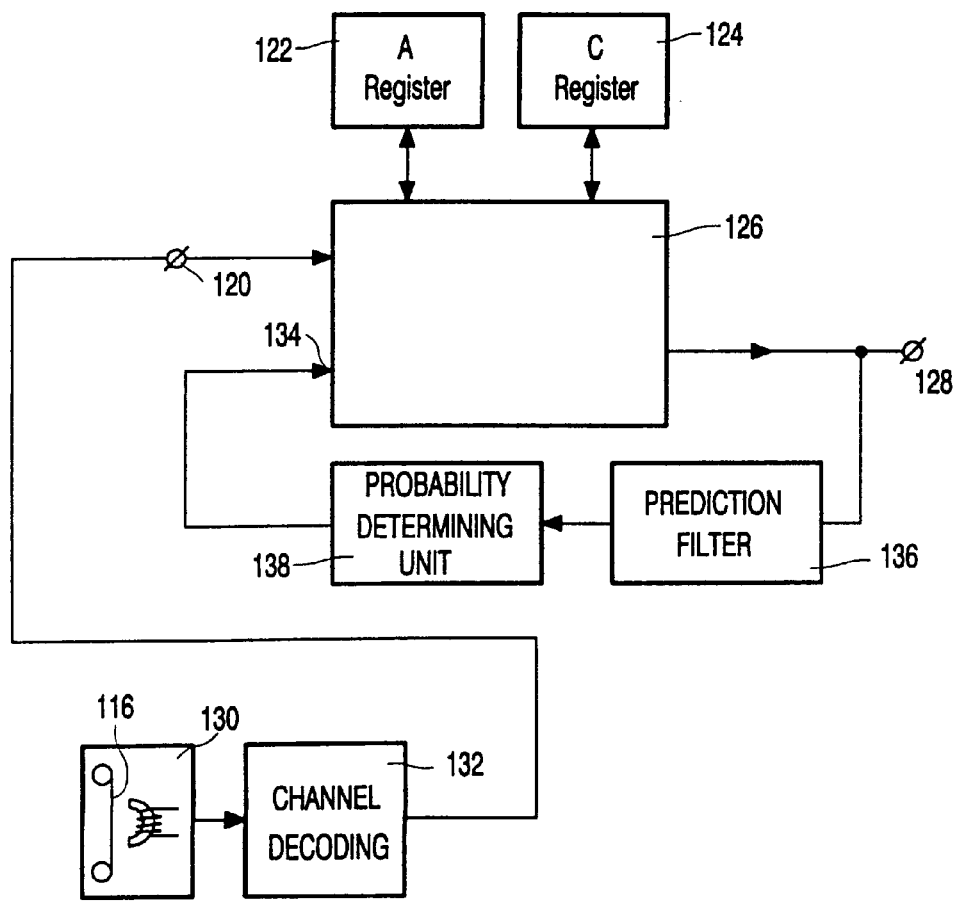
FIG. 12 shows an embodiment of the decoder apparatus.

FIG. 12 shows an embodiment of the decoder apparatus in accordance with the invention. The decoder apparatus includes an input terminal 120 for receiving the encoded information signal. Finite sized first and second registers 122 and 124 are present, for storing the A parameter and the C parameter, respectively.

A processing unit 126 is available for carrying out the arithmetic decoding on the encoded information signal that is received via its input 120, in response to a probability signal supplied to the processing unit 126 via an input 134. The probability signal can be obtained in a well known way. An example of deriving the probabilities for a 1-bit audio signal is shown in [Bruek97]. In this example, the probabilities are derived from the decoded output signal that is supplied to the output 128, namely by carrying out a prediction filtering on the decoded output signal in prediction filter 136 and generating the probability signal in response to the output signal of the prediction filter 136 in the probability determining unit 138. It should be understood that, without going into very much detail as regards the processing unit 126, this unit includes circuitry for retrieving the values for the A and C parameters from the first and second registers, as well as circuitry for storing the updated and renormalized values for A and C in the first and second registers 122 and 124, respectively, after having decoded a symbol. Further, the unit 126 includes circuitry for carrying out the steps shown in the FIGS. 4, 5, 9 and 10.

The circuitry for retrieving the value of the A parameter from the register 122 further includes means for truncating the value of the A parameter prior to carrying out the calculation A.p. This truncation is in the same way as described above for the encoder, so that from a further explanation will be refrained.

Preferably, the decoder apparatus is further provided with a channel decoding unit 132, well known in the art, for channel decoding (and, if needed, error correcting) the channel encoded information signal into the arithmetically encoded information signal for the arithmetic decoder 126, and a read unit 130 for reading the channel encoded signal from a record carrier, such as the magnetic record carrier 116, or the optical record carrier 118.

Arithmetic coding is applied in most modern lossless and lossy coding schemes for video and audio. It can also be applied in the compression of computer data (such as, e.g., text files). The application envisaged here, is in lossless coding of 1-bit audio signals. Reference is made in this respect to U.S. Ser. No. 08/966,375, corresponding to EP patent application no. 97201680.2 (PHN16405), U.S. Ser. No. 08/937,435, corresponding to international patent application no. IB 97/01156 (PHN16452). These two citations being hereby incorporated herein in whole by reference.

Whilst the invention has been described with reference to preferred embodiments thereof, it is to be understood that these are not limitative examples. Thus, various modification may become apparent to those skilled in the art, without departing from the scope of the invention, as defined by the claims.

Further, the invention lies in each and every novel feature or combination of features.

REFERENCES

[Lang81] G. G. Langdon et al, "Compression of black-white images with arithmetic coding", IEEE Trans. on Corn., Vol. COM-29, pp. 858–67, June 1981.

[Witt87] I. H. Witten et al, "Arithmetic coding for data compression", Communications ACM, Vol. 30, pp. 520–540, June 1987.

[Lang 84] G. G. Langdon, "An introduction to arithmetic coding", IBM J. Res. Develop., Vol. 28, pp. 135–149, March 1984.

[Penn88] W. B. Pennebaker et al, "An overview of the basic principles of the Q-coder adaptive binary arithmetic coder", IBM J. Res. Develop., Vol. 32, pp. 717–26, November 1988.

[Riss89] J. Rissanen et al, "A multiplication-free multialphabet arithmetic code", IEEE Trans on Com, Vol. 37, pp. 93–8, February 1989

[Cham90] U.S. Pat. No. 4,973,961

[Chev91a] D. Chevion et al, "High efficiency, multiplication free approximation of arithmetic coding" in Data Compression Conference (DCC '91), pp. 43–52, 1991

[Chev91b] U.S. Pat. No. 4,989,000.

[Feyg93] G. Feygin et al, "Minimizing error and VLSI complexity in the multiplication free approximation of arithmetic coding" in Data Compression Conference" (DCC '93), pp. 118–127, Mar. 30–Apr. 1, 1993.

[Howard94] P. G. Howard et al, "Arithmetic coding for data compression", Proc. IEEE, Vol. 82, no. 6, pp. 857–65, June 1994.

[Moff95] A. Moffat et al, "Arithmetic coding revisited" in Data Compression Conference (DCC'95), pp. 202–11, 1995.

[Bruek97] F. Bruekers et al, "Improved lossless coding of 1-bit audio signals", presented at 103rd Convention of the AES, Sep. 26–29, 1997, preprint 4563(I–6)

What is claimed is:

1. A method comprising the steps of:

providing a sequence of n-bit symbols, n being an integer and $n \geq 1$;

providing finite sized first and second registers for storing values of an A parameter and a C parameter, respectively, the C parameter having a relationship with a boundary of a value interval and the A parameter having a relationship with the size of the interval;

(a) inputting a symbol of the information signal and at least one corresponding probability value of the associated symbol for encodings;

(b) retrieving the values for the A and C parameters from the first and second registers, respectively, and if $b_i$ equals '1', then truncating the value of the A parameter $0.b_0 b_1 \ldots b_{i-1} b_i \ldots$ to bit $b_{i-1}$ and adding '1' at a position of bit $b_{i-1}$ to the truncated value of A;

(c) splitting the value interval corresponding to the value of the A parameter into sub intervals corresponding to at least one probability value, and selecting one of the subintervals in response to the symbol;

(d) updating the value of at least the A parameter to correspond with the size of the selected subinterval, in order to become the new size of the interval for encoding a next symbol in the information signal;

(e) storing the updated value for the A parameter in the first register;

(f) continuing the method starting at step (a) for encoding the next symbol.

2. A method comprising the steps of:

providing a sequence of n-bit symbols, n being an integer and $n \geq 1$;

providing finite sized first and second registers for storing an A parameter and a C parameter, respectively, the C parameter having a relationship with a boundary of a value interval and the A parameter having a relationship with the size of the interval;

(a) inputting a symbol of the information signal and a value of at least one corresponding probability of the symbol for encoding;

(b) retrieving the values for the A and C parameters from the first and second registers, respectively, truncating the value of the A parameter $0.b_0 b_1 \ldots b_{i-1} b_i \ldots$ to bit $b_{i-1}$, and if $b_{i-1}$='0' and $b_i$='1' then raising $b_{i-1}$ to '1';

(c) splitting the value interval corresponding to the value retrieved from the first register into sub intervals corresponding to the at least one probability value, and selecting one of the subintervals in response to the symbol;

(d) updating the value of at least the A parameter to correspond with the size of the selected subinterval, in order to become the new size of the interval for encoding the next symbol in the information signal;

(e) storing the updated value for the A parameter in the first register;

(f) continuing the method starting at step (a) for encoding the next symbol.

3. A method comprising the steps of:

providing a sequence of n-bit symbols, n being an integer and $n \geq 1$;

providing finite sized first and second registers for storing an A parameter and a C parameter, respectively, the C parameter having a relationship with a boundary of a value interval and the A parameter having a relationship with the size of the interval;

(a) inputting a symbol of the information signal and at least one corresponding probability value of the associated symbol for encodings;

(b) retrieving the values for the A and C parameters from the first and second registers, respectively, truncating the value of the A parameter $0.b_0 b_1 \ldots b_{i-1} b_i \ldots$ to bit $b_{i-1}$, and making bit $b_{i-1}$ equal to '1';

(c) splitting the value interval corresponding to the value retrieved from the first register into sub intervals corresponding to the at least one probability value, and selecting one of the subintervals in response to the symbol;

(d) updating the value of at least the A parameter to correspond with the size of the selected subinterval, in order to become the new size of the interval for encoding the next symbol in the information signal;

(e) storing the updated value for the A parameter in the first registers;

(f) continuing the method starting at step (a) for encoding the next symbol.

4. Apparatus comprising:

input means for receiving an arithmetically encoded information signal;

finite sized first and second registers, the first register for storing an A parameter, the A parameter having a relationship with a size of a value interval, the second register for storing a C parameter, the contents of the second register before a decoding step being obtained from the contents of the second register obtained in a previous decoding step, by shifting m bits of the arithmetically encoded information signal into the second register, where m is a variable integer and $m \geq 0$;

generator means for generating at least one probability value for an associated symbol to be decoded;

retrieval means for retrieving the values for the A and C parameters from the first and second registers, respectively, including means if $b_i$ equals '1', for truncating the value of the A parameter $0.b_0 b_1 \ldots b_{i-1} b_i \ldots$ to bit $b_{i-1}$ and adding '1' at the position of bit $b_{i-1}$ to the truncated value of A;

deriving means for deriving a symbol in response to the at least one probability value, and in response to a value for the A parameter and a value for the C parameter;

means for updating the value of at least the A parameter in order to become the new size of the interval for decoding the next symbol of the information signal;

means for outputting the derived symbol in an information signal including a sequence of n-bit symbols, n being an integer and $n \geq 1$;

means for storing the updated value for the A parameter in the first register.

5. Apparatus comprising:

input means for receiving an arithmetically encoded information signal;

finite sized first and second registers, the first register for storing an A parameter, the A parameter having a relationship with a size of a value interval, the second register for storing a C parameter, the contents of the second register before a decoding step being obtained from the contents of the second register obtained in a previous decoding step, by shifting m bits of the arithmetically encoded information signal into the second register, where m is a variable integer and $m \geq 0$;

generator means for generating at least one probability value for an associated symbol to be decoded;

retrieval means for retrieving the values for the A and C parameters from the first and second registers, respectively, for truncating the value of the A parameter $0.b_0b_1 \ldots b_{i-1}b_i \ldots$ to bit $b_{i-1}$, and for if $b_{i-1}=$ '0' and $b_i=$ '1' then raising $b_{i-1}$ to '1'.

deriving means for deriving a symbol in response to the at least one probability value, and in response to a value for the A parameter and a value for the C parameter;

means for updating the value of at least the A parameter in order to become the new size of the interval for decoding the next symbol of the information signal;

means for outputting the decoded symbol in an information signal including a sequence of n-bit symbols, n being an integer and $n \geq 1$;

means for storing the updated value for the A parameter in the first register.

6. Apparatus comprising:

input means for receiving an arithmetically encoded information signals;

finite sized first and second registers, the first register for storing an A parameter, the A parameter having a relationship with the size of a value interval, the second register for storing a C parameter, the contents of the second register before a decoding step being obtained from the contents of the second register obtained in a previous decoding step, by shifting m bits of the arithmetically encoded information signal into the second register, where m is a variable integer and $m \geq 0$;

generator means for generating at least one probability value for an associated symbol to be decoded;

retrieval means for retrieving the values for the A and C parameters from the first and second registers, respectively, truncating the value of the A parameter $0.b_0b_1 \ldots b_{i-1}b_i \ldots$ to the bit $b_{i-1}$, and making bit $b_{i-1}$ equal to '1';

deriving means for deriving a symbol in response to the at least one probability value, and in response to a value for the A parameter and a value for the C parameter;

means for updating the value of at least the A parameter in order to become the new size of the interval for decoding the next symbol of the information signal;

means for outputting the decoded symbol in an information signal including a sequence of n-bit symbols, n being an integer and $n \geq 1$;

means for storing the updated value for the A parameter in the first register.

7. The method of claim 1, wherein:

the step of updating further including updating the C value to correspond with a boundary of the selected sub interval, in order to become the new value of the C parameter for encoding the next symbol in the information signal; and the step of storing further including storing the updated value of the C parameter in the second register.

8. The method of claim 1, in which the step of updating further includes the step of re-normalizing the values for the A and C parameters, prior to storing the re-normalized values for the A and C parameters in the first and second registers, respectively, the re-normalizing step including the steps:

(g1) comparing the value of the A parameter with a first binary value;

if the value for the A parameter is not smaller than said first binary value, then terminating the re-normalizing step, and if the value for the A parameter is smaller than the first binary value, then performing the steps of:

(g2) multiplying the value for the A parameter with a first integer value to update the value of A; and (g3) continuing the re-normalizing starting at step g1.

9. The method of claim 8, in which the re-normalizing step further includes the steps of:

(g4) if the value of A is smaller than the first binary value in (g1), then comparing the value for the C parameter with a second and a third binary value, the second binary value being larger than the third binary value; and if the value for the C parameter is smaller than the second binary value, and larger than or equal to the third binary value, then performing the steps of:

(g4) subtracting a fourth binary value from the value for the C parameter so as to obtain an intermediate value for C; and (g5) multiplying the intermediate value for the C parameter with a second integer value to update the value of C.

10. The method of claim 8, in which the first binary value equals $0.100 \ldots 0$.

11. The method of claim 8 in which the second binary value equals $1.000 \ldots 0$.

12. The method of claim 8, in which the first integer value equals 2.

13. The method of claim 9, in which the third binary value equals $0.100 \ldots 0$.

14. The method of claim 9, in which the fourth binary value equals $0.1000 \ldots 0$.

15. The method of claim 9, in which the second integer value equals 2.

16. The method of claim 1 further comprising the step of channel encoding the encoded information signal into a channel encoded signal.

17. The method of claim 16, further comprising the step of recording the channel signal on a record carrier.

18. Apparatus for carrying out the method of claim 1, comprising:

means including finite sized first and second registers for storing an A parameter and a C parameter, respectively, the C parameter having a relationship with a boundary of a value interval and the A parameter having a relationship with the size of the interval;

input means for receiving a sequence of n-bit symbols of a digital information signal, n being an integer and $n \geq 1$, and at least one corresponding probability value for each symbol for encoding;

retrieval means for retrieving the values for the A and C parameters from the first and second registers, respectively, including means for if $b_i$ equals '1' then truncating the value of the A parameter $0.b_0b_1 \ldots b_{i-1}b_i \ldots$ to bit $b_{i-1}$ and adding '1' at the position of the bit $b_{i-1}$ to the truncated value of A;

means for splitting the value interval corresponding to the value of the A parameter into sub intervals corresponding to the at least one probability value, and selecting one of the sub intervals in response to the symbol;

means for updating the value of at least the A parameter to correspond with the size of the selected subinterval in order to become the new size of the interval for encoding the next symbol in the information signal; and means for storing the updated value for the A parameter in the first register.

19. Apparatus for carrying out the method of claim 2, comprising;
  means including finite sized first and second registers for storing an A parameter and a C parameter, respectively, the C parameter having a relationship with a boundary of a value interval and the A parameter having a relationship with the size of the interval;
  input means for receiving a series of n-bit symbols of a digital information signal, n being an integer and $n \geq 1$, and at least one corresponding probability value for each symbol for encoding;
  retrieval means for retrieving the values for the A and C parameters from the first and second registers, respectively, truncating the value of the A parameter $0.b_0b_1 \ldots b_{i-1}b_i \ldots$ to bit $b_{i-1}$, and if $b_{i-1}$='0' and $b_i$='1' then raising $b_{i-1}$ to '1';
  means for splitting the value interval corresponding to the value retrieved from the first register into sub intervals corresponding to the at least one probability value, and selecting one of the sub intervals in response to the symbol;
  means for updating the value of at least the A parameter to correspond with the size of the selected subinterval in order to become the new size of the interval for encoding the next symbol in the information signal;
  means for storing the updated value for the A parameter in the first register.

20. Apparatus for carrying out the method of claim 3, comprising:
  means including finite sized first and second registers for storing an A parameter and a C parameter, respectively, the C parameter having a relationship with a boundary of a value interval and the A parameter having a relationship with the size of the interval;
  input means for receiving a sequence of n-bit symbols of a digital information signal, n being an integer and $n \geq 1$, and at least one corresponding probability value for the associated symbol for encoding;
  retrieval means for retrieving the values for the A and C parameters from the first and second registers, respectively, truncating the value of the A parameter $0.b_0b_1 \ldots b_{i-1}b_i \ldots$ to bit $b_{i-1}$, and making bit $b_{i-1}$ equal to '1';
  means for splitting the value interval corresponding to the value retrieved from the first register into sub intervals corresponding to the at least one probability value, and selecting one of the sub intervals in response to the symbol;
  means for updating the value of at least the A parameter to correspond with the size of the selected subinterval in order to become the new size of the interval for encoding the next symbol in the information signal;
  means for storing the updated value for the A parameter in the first register.

21. The apparatus of claim 18, further comprising means for re-normalizing the values for the A and C parameter, prior to storing the re-normalized values for the A and C parameters in the first and second registers, respectively, and including:
  means for (g1) comparing the value for the A parameter with a first binary value;
  means for (g2) if the value for the A parameter is not smaller than the first binary value then terminating the re-normalizing; and
  means for if the value for the A parameter is smaller than the first binary value then (g2) multiplying the value for the A parameter with a first integer value to update the value of the A parameter, and (g3) reinitiating the comparing means for continuing the re-normalizing.

22. The apparatus of claim 21, in which the re-normalizing means further include:
  means for if the value of A is smaller than the first binary value then (g4) comparing the value for the C parameter with a second and a third binary value, the second binary value being larger than the third binary value;
  means for if the value of C is smaller than the second binary value and larger than or equal to the third binary value then (g4) subtracting a fourth binary value from the value for the C parameter so as to obtain an intermediate value for C;
  means for if the value of C is smaller than the second binary value and larger than or equal to the third binary value then (g5) multiplying the intermediate value for the C parameter with a second integer value to update the value of the C parameter.

23. The apparatus of claim 18, further comprising means for channel encoding the encoded information signal into a channel encoded signal.

24. The apparatus of claim 23, further comprising recording means for recording the channel signal on a record carrier.

25. The apparatus of claim 4, further comprising channel decoding means for channel decoding the arithmetically encoded information signal, prior to arithmetic decoding.

26. The apparatus of claim 4, further comprising read means for reading the channel encoded arithmetically encoded information signal from a record carrier.

* * * * *